United States Patent [19]

Nishijima et al.

[11] Patent Number: 4,694,204
[45] Date of Patent: Sep. 15, 1987

[54] TRANSISTOR CIRCUIT FOR SIGNAL MULTIPLIER

[75] Inventors: Kazunori Nishijima; Mitsutoshi Sugawara, both of Tokyo, Japan

[73] Assignee: NEC Corporation, Tokyo, Japan

[21] Appl. No.: 706,597

[22] Filed: Feb. 28, 1985

[30] Foreign Application Priority Data

Feb. 29, 1984 [JP] Japan .................................. 59-38010
Aug. 6, 1984 [JP] Japan .................................. 59-164434

[51] Int. Cl.$^4$ ........................ H03B 17/00; G06G 7/16
[52] U.S. Cl. .................................... 307/494; 307/529; 307/498; 328/160
[58] Field of Search .............. 307/494, 498, 512, 529; 328/160

[56] References Cited

U.S. PATENT DOCUMENTS

| | | | |
|---|---|---|---|
| 3,838,262 | 9/1974 | vande Plassche | 364/841 |
| 3,956,643 | 5/1976 | Hite | 307/497 |
| 4,308,471 | 12/1981 | Misawa | 307/492 |
| 4,586,155 | 4/1986 | Gilbert | 364/841 |

Primary Examiner—Stanley D. Miller
Assistant Examiner—Richard Roseen
Attorney, Agent, or Firm—Burns, Doane, Swecker & Mathis

[57] ABSTRACT

A transistor circuit for a signal multiplier used in, for example, a demodulator by means of the Costas loop method is disclosed. The transistor circuit comprises first to third circuit stages each including first and second transistors coupled in a differential form. The first to third circuit stages are connected in tandem with one another such that the output signal current of each circuit stage is supplied to the succeeding circuit stage without a substantial change. Further, each of the first to third circuit stages is supplied with one of or both of two input signals P and Q. As a result, the transistor circuit produces an output signal representing a signal multiplication: $P \times Q \times (P+Q) \times (P-Q)$.

10 Claims, 3 Drawing Figures

TRANSISTOR CIRCUIT FOR SIGNAL MULTIPLIER

BACKGROUND OF THE INVENTION

The present invention relates to a transistor circuit, and more particularly to a transistor signal multiplier used in a demodulator for phase-shift keyed signals.

The digital phase modulation employing a phase-shift keying (referred to as "PSK") technique is known as one of the modulation methods in transmitting digital signals by means of carrier waves and is featured in that the phase of the carrier wave is shifted in accordance with the data of digital signals For example, the phase of the carrier wave is shifted by 0°, 90°, 180°, or 270° for every 2 bits of the digital signal to be transmitted. It is superior in its frequency band characteristics and code error rate characteristics to other modulation methods such as the amplitude modulation, the frequency modulation and the pulse modulation, and therefore is widely used in PCM microwave communications, satellite communications, data transmission modems and the like. The PSK technique is classified into two-, four- and eight-phase ones which can transmit 1-, 2- and 3-bit data per one sampling period, respectively. The four-phase PSK, i.e., quadraphase-shift keying (QPSK), is most widely used at present.

In the QPSK technique, the digital signal to be transmitted is divided for every two bits which can take either one of the four combinations (0, 0), (0, 1), (1, 0), and (1, 1). For these four combinations, the phase of the carrier wave is shifted by 0, $\pi/2$, $\pi$, and $3/2\pi$, respectively. The 2-bit digital data of each combination is contained in the inphase component or the quadraphase component of the carrier wave.

For demodulation, a reference signal having the same phase as the carrier wave is generated. The phase of the received carrier wave is compared with the phase of the reference signal to obtain a signal P and also compared with the $\pi/2$-shifted phase of the reference signal to produce a signal Q. The polarities of the signals P and Q are detected to determine the combination of 2-bit data.

Thus, the demodulator requires a circuit for generating the reference signal having the same phase as the carrier wave, i.e., a reference carrier recovering circuit. For this purpose, the so-called "Costas loop method" is utilized, in which all of two synchronous-detected signals P and Q, their summed signal (P+Q), and their subtracted signal (P−Q) are multiplied by a signal multiplier, the multiplied result being supplied through a low-pass filter (LPF) to a voltage controlled oscillator (VCO). The output of the VCO is used as the reference signal.

Since the signal multiplier can be constructed of conventional double-balanced differential circuits, the carrier recovering circuit by the Costas loop method is suitable for being formed as a semiconductor integrated circuit device.

However, the multiplier according to the prior art requires a large number of circuit elements in order to perform the multiplication of four signals, because it is composed of three double-balanced differential circuits provided in parallel, two level shift circuits each coupling the adjacent two differential circuits, and a peripheral circuit for preparing the signals (P+Q) and (P−Q). As a result, the semiconductor chip on which the multiplier is formed becomes large in size. Further, the multiplied result of the four signals is derived after being passed through three stages of the double-balanced differential circuits which cause time delays by a time constant composed of a load resistor and its stray capacitance, thereby resulting in a considerable low multiplying speed. The time delays also result in an error in phase of the reference carrier. Moreover, power consumption is increased because of two level shift circuits between the double-balanced differential circuits through which a relatively large current flows.

SUMMARY OF THE INVENTION

An object of the present invention is to provide a transistor circuit for a multiplier for four signals which requires a smaller number of circuit elements, has a higher operating speed and consumes less power.

Another object of the present invention is to provide a transistor circuit as a signal multiplier suitable for being formed as an integrated circuit device.

Still another object of the present invention is to provide an improved four-signal multiplier used in a carrier recovering circuit employing the Costas loop.

A transistor circuit according to the present invention comprises a plurality of circuit stages each of which includes first to third input terminal, at least one output terminal, a first transistor having an emitter connected to the first input terminal, a base connected to the second input terminal and a collector connected to the output terminal, and a second transistor having an emitter connected to the first input terminal and a base connected to the third input terminal, the circuit stages being connected in tandem with one another such that the output terminal of each stage is connected directly to the first input terminal of a succeeding stage, means for supplying a first signal to the first input terminal of the first circuit stage, means for supplying second signals to at least one of the second and third input terminals of each stage, respectively, and means for deriving an output signal from the output terminal of the last stage.

Thus, the circuit according to the present invention is characterized by such a tandem connection that the output of each stage is supplied directly to the succeeding stage as an input at the first input terminal. Each of the circuit stages functions as a multiplier, and favorably further includes third and fourth transistors to form a double-balanced differential circuit together with the first and second transistor.

In case the circuit according to the present invention is used as the four-signal multiplier in the carrier recovering circuit employing the Costas loop, three circuit stages are provided. In the first stage, two signals (e.g., the synchronous-detected signals P and Q) are multiplied, and the multiplied output is supplied directly to the second stage to control the common emitter current of the first and second transistors in the second stage. The output of the first stage is then multiplied with another signal (e.g., the summed signal (P+Q)) in the second stage. The output signal of the second stage directly controls the common emitter current in the third stage, and is thereby multiplied with the remaining signal (i.e., the substracted signal (P−Q) in the third stage. As a result, the third stage produces the multiplied signal of all the four signals, that is, two modulated signals P and Q and their summed and subtracted signals (P+Q) and (P−Q).

Since the outputs of the first and second stages are supplied directly to the second and third stages, respectively, the circuit according to the present invention carries out the signal multiplying operation at a high speed, and is applicable to the demodulator for the quadraphase-shift keyed signal having a higher frequency band. The circuit requires only one current source and its circuit elements are remarkably reduced in number, and therefore the power consumed in the circuit is small. The semiconductor chip fabricated to form the circuit also becomes small in area.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
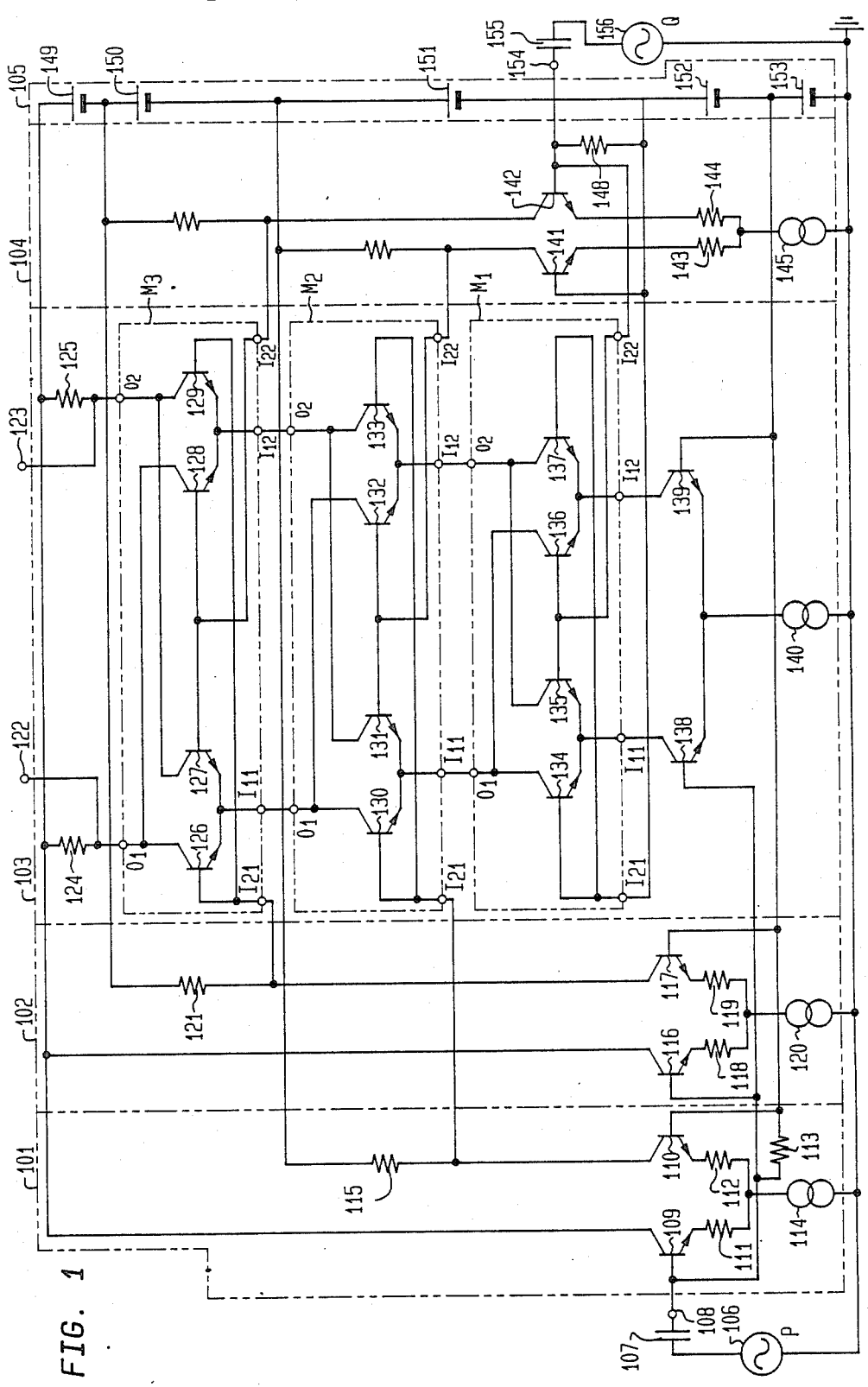
FIG. 1 is a circuit diagram showing a preferred embodiment of the present invention.

Referring to FIG. 1, there is shown a transistor circuit according to one embodiment of the present invention. This transistor circuit is constructed of three differential amplifiers 101, 102 and 104, a four-signal multiplier 103 and a bias circuit 105. The differential amplifier 101 is composed of transistors 109 and 110, emitter resistors 111 and 112, a constant current source 114 and a load resistor 115. The base of the transistor 110 is biased by a bias source 153 in the bias circuit 105, and the transistor 109 is also biased through a resistor 113 by the bias source 153 and further supplied with a signal P from a signal source 106 through a capacitor 107 and a signal input terminal 108. The summed resistance value of the resistors 111 and 112 is designed to be equal to the value of the resistor 115, so that a signal having the same phase as and the substantially equal level to the signal P is derived from the resistor 115. The differential amplifier 102 is composed of transistors 116 and 117, emitter resistors 118 and 119, a constant current source 120 and a load resistor 121. The transistors 116 and 117 are also biased by the bias source 153, and the transistor 116 is further supplied with the signal P. The relationship of the resistance values among the resistors 118, 119 and 121 in the amplifier 102 is selected similarly to that in the differential amplifier 101, and hence a signal which is in phase with and at a level substantially equal to the signal P is produced across the resistor 121. The differential amplifier 104 is composed of transistors 141 and 142, emitter resistors 143 and 144, a bias resistor 148, and load resistors 146 and 147. A signal Q from a signal source 156 is supplied through a capacitor 155 and a signal input terminal 154 to the base of the transistor 142. The transistors 141 and 142 are biased by the summed voltage of the bias sources 152 and 153. The signals in phase with and in opposite phase to the signal Q are thereby produced across the load resistors 146 and 147 with a substantially equal level, respectively.

The four-signal multiplier 103 is constructed of a constant current source 140, transistors 138 and 139 forming a differential amplifier, load resistors 124 and 125 and first to third multipliers $M_1$ to $M_3$. Each of the multipliers $M_1$ to $M_3$ is well-known as a double-balanced differential circuit and composed of a pair of first input terminals $I_{11}$ and $I_{12}$, a pair of second input terminals $I_{21}$ and $I_{22}$, a pair of output terminals $O_1$ and $O_2$, and first to fourth transistors. The emitters of the first and second transistors are connected in common to one ($I_{11}$) of the first input terminals, and the emitters of the third and fourth transistors are connected in common to the other ($I_{12}$) of the first input terminals. The bases of the first and fourth transistors are connected in common to one ($I_{21}$) of the second input terminals, and the bases of the second and third transistors are connected in common to the other ($I_{22}$) of the second input terminals. The collectors of the first and third transistors are connected in common to one ($O_1$) of the output terminals, and the collectors of the second and fourth transistors are connected in common to the other ($O_2$) of the output terminals. The first to third multipliers $M_1$ to $M_3$ include transistors 134 to 137, 130 to 133, and 126 to 129 as their first to fourth transistors, respectively. The output terminals $O_1$ and $O_2$ of the first multiplier $M_1$ are connected to the first input terminals $I_{11}$ and $I_{12}$ of the second multiplier $M_2$, and the output terminals $O_1$ and $O_2$ of the latter are connected to the first input terminals $I_{11}$ and $I_{12}$ of the third multiplier $M_3$. The output terminals $O_1$ and $O_2$ of the third multiplier are connected to the resistors 124 and 125 and further connected to signal output terminals 122 and 123.

Since the transistor 138 is supplied at its base with the signal P and constitutes the differential amplifier together with the transistor 139, the signals in phase with and in opposite phase to the signal P appear at the collectors of the transistors 138 and 139, respectively. The transistor 139 is biased by the bias source 153. The collectors of the transistors 138 and 139 are connected to the first input terminals $I_{11}$ and $I_{12}$ of the first multiplier $M_1$, respectively. The signal Q is supplied to the common base connection point of the transistors 135 and 136, i.e., to one ($I_{21}$) of the second input terminal of the first multiplier $M_1$. The other ($I_{22}$) of the second input terminals is biased by the sources 152 and 153. Accordingly, the first multiplier $M_1$ performs the signal multiplication:

"P×Q"

and produces output signal currents at the output terminals $O_1$ and $O_2$, respectively. The output signal current at the one output terminal $O_1$ has the same phase as the multiplied result of the signals P and Q, and that at the other output terminal $O_2$ has a phase opposite to the multiplied result.

If desired, the signal opposite to the signal P may be supplied to the transistor 139, and the signal opposite to the signal Q may be supplied to the other second input terminal $I_{22}$ of the first multiplier $M_1$.

The signal currents at the output terminals $O_1$ and $O_2$ of the first multiplier is supplied to the second multiplier $M_2$ as its input signal currents at the first input terminals $I_{11}$ and $I_{12}$ without any change. other hand, the signal P is supplied to the common base of the transistors 130 and 133 (i.e., the one second input terminal $I_{21}$), and the transistors 131 and 132 are supplied through the common base point (i.e., the other second input terminal $I_{22}$) with the signal in phase with the signal Q. Accordingly, the second multiplier $M_2$ carries out the signal multiplication:

"P×Q×(P−Q)"

to produce the signal currents in phase with and in opposite phase to the multiplied result at its output terminals $O_1$ and $O_2$, respectively.

The third multiplier $M_3$ is supplied at its first input terminals $I_{11}$ and $I_{12}$ with the output signal currents of the second multiplier $M_2$ as they are. In this third multiplier, the common base connection point of the transistors 126 and 129, that is, the one second input terminal $I_{21}$, is supplied with the signal in phase with the signal P from the differential amplifier 102, and the common base connection point of the transistors 127 and 128, that is, the other second input terminal $I_{22}$ is supplied with the signal in opposite phase to the signal Q from the differential amplifier 104. As a result, the signal multiplication:

$$"P \times Q \times (P-Q) \times (P-(-Q))"$$

is carried out by the third multiplier $M_3$ and output signal currents as the multiplied result are produced at its output terminals $O_1$ and $O_2$. The phases of the signal currents at the terminals $O_1$ and $O_2$ are opposite to each other. The output currents from the third multiplier $M_3$ result in output signal voltages across the load resistors 124 and 125, respectively, so that the multiplied output signals of the opposite phase to each other are derived from the output terminals 122 and 123, respectively. Thus, the circuit shown in FIG. 1 attains the signal multiplication of four signals:

$$"P \times Q \times (P-Q) \times (P+Q)".$$

If desired, either one of the load resistors 124 and 125 may be omitted to obtain only one output signal. Each of the bias sources 149 to 153 in the bias circuit 105 is indicated as a battery generating a predetermined voltage, but may be composed of a combination of diodes and/or resistors, for example.

The four-signal multiplier 103 is provided with only one pair of loads (i.e., the resistors 124 and 125), and no load resistors are provided at the output terminals $O_1$ and $O_2$ of the first and second multipliers $M_1$ and $M_2$. Moreover, no level shift circuit is required between the respective multipliers. Accordingly, the four-signal multiplier 103 carries out its multiplications at a high speed. Since only one current source 140 is provided in the four-signal multiplier 103, the power consumed therein is relatively low. Furthermore, the number of the circuit elements is reduced since no level shift circuit is required.

Figure 2:
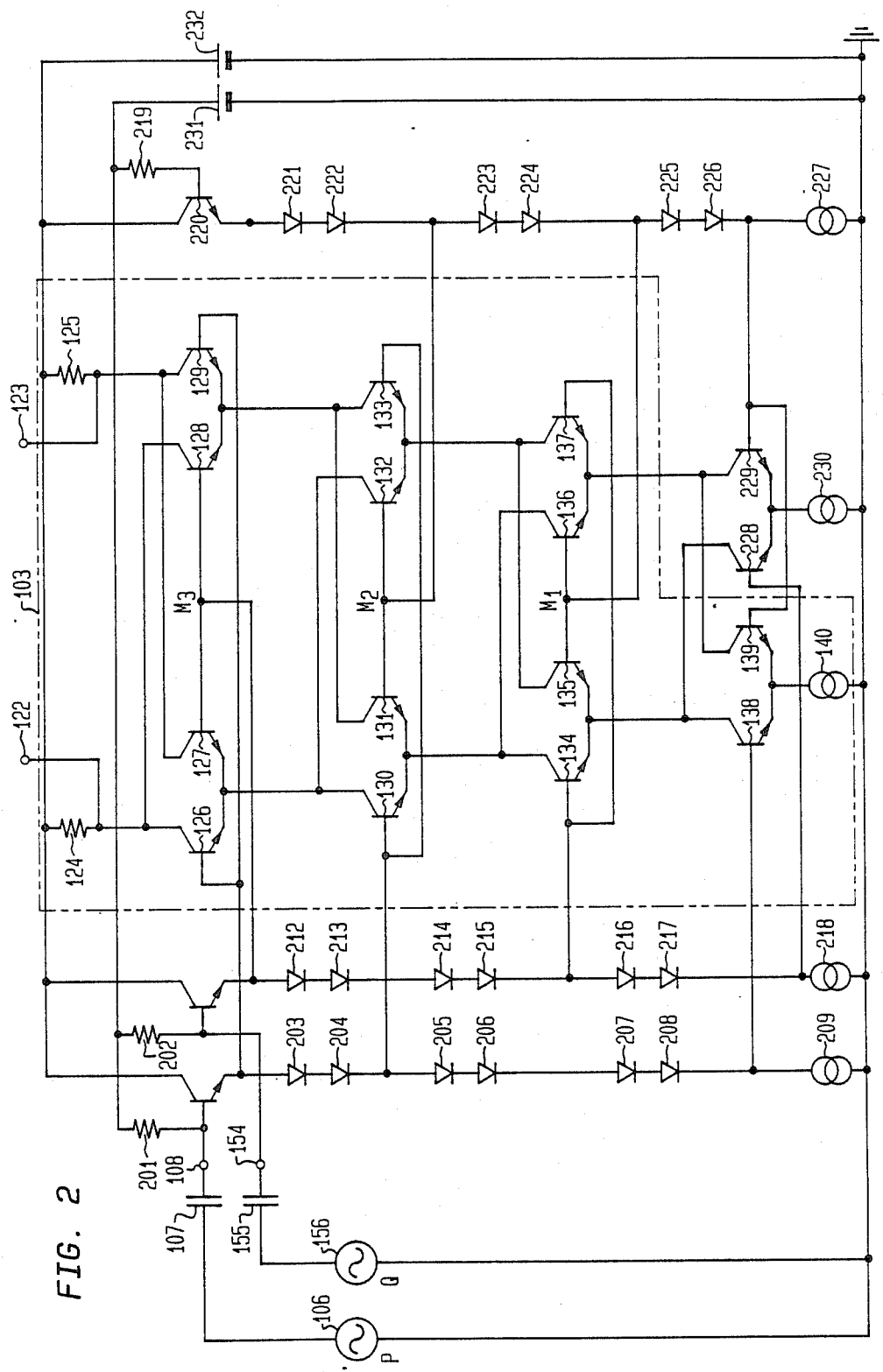
FIG. 2 is a circuit diagram showing another preferred embodiment of the present invention.

FIG. 2 shows another embodiment of the present invention, and the same constituents as those in FIG. 1 are indicated by the same reference numerals. The signal P from the signal source 106 is supplied through the capacitor 107 and the input terminal 108 to the base of a transistor 202 forming an emitter follower, and a signal in phase with the signal P is thus generated at the emitter of the transistor 202. Diodes 203 to 208 connected in series are provided for the level shift of the signal P, and each of them generates a forward voltage drop of about 0.7 V thereacross. The signals in phase with the signal P appear at the respective connection portions of the diodes 203 to 208. A constant current source 209 supplies a bias current to the transistor 202 and the diodes 203 to 208. The voltage of a bias source 231 is applied through a resistor 201 to the transistor 202.

The signal Q from the signal source 156 is supplied through the capacitor 155 and the input terminal 154 to the base of a transistor 211 forming an emitter follower. The emitter of the transistor 211 is connected through level shifting diodes 212 to 217 to a constant current source 218, and the base thereof is connected through a resistor 210 to the bias source 231. The signals in phase with the signals Q appear at the emitter of the transistor 211 and at the respective connection points of the diodes 212 to 218. In order to generate bias voltages for the multiplier 103, there is provided a bias circuit composed of a transistor 220 having its base connected bia a resistor 219 to the bias power source 321, a series connection circuit of diodes 221 to 226, and a constant current source 227. The four-signal multiplier 103 has the same construction as that shown in FIG. 2, and is energized by a power supply source 232. Transistor 228 and 229 form a differential amplifier. The transistor 228 is supplied with the level-shifted signal Q, and the collector thereof is connected to the collector of the transistor 138. The bias voltage is supplied to the transistor 229, the collector of which is connected to the collector of the transistor 139.

The transistor 138 is supplied at its base with the level-shifted signal P along with the bias voltage, and the transistor 228 is supplied at its base with the level-shifted signal Q together with the same bias voltage. The transistors 138 and 228 cooperate with the transistors 139 and 229 to form differential amplifiers, respectively. Accordingly, the signals in phase with and in opposite phase to the summed signal (P+Q) appear at the connection point of the collectors of the transistors 138 and 228 and that of the collectors of the transistors 139 and 229, respectively. In the first multiplier $M_1$, the transistors 134 and 137 are supplied at their bases with the signal in phase with the signal Q together with the bias voltage, and the transistors 135 and 136 are applied at their bases with the same bias voltage. In the second multiplier $M_2$, the transistors 130 and 133 are supplied at their bases with the signal in phase with the signal P along with the bias voltage, and the transistors 131 and 132 receives at their bases with the same bias voltage. In the third multiplier $M_3$, the signals in phase with the signals P and Q are supplied in a differential manner to the common base connection point of the transistors 126 and 129 and that of the transistors 127 and 128, respectively. As a result, a signal voltage proportional to $[(P+Q) \times P \times Q \times (P-Q)]$ is generated from the signal output terminals 122 and 123, respectively. The phase of the signals at the terminals 122 and 123 are opposite to each other.

Also in the circuit shown in FIG. 2, there are obtained effectes of a high speed, low power consumption and a smaller number of circuit elements. Moreover, the signals P and Q are supplied to the multiplier 103 by means of the emitter follower transistor circuits. In other words, the circuit does not require the load resistors 121, 115, 146 and 147 shown in FIG. 1. Therefore, the signal delay is further decreased to perform a higher multiplication operation speed.

Figure 3:
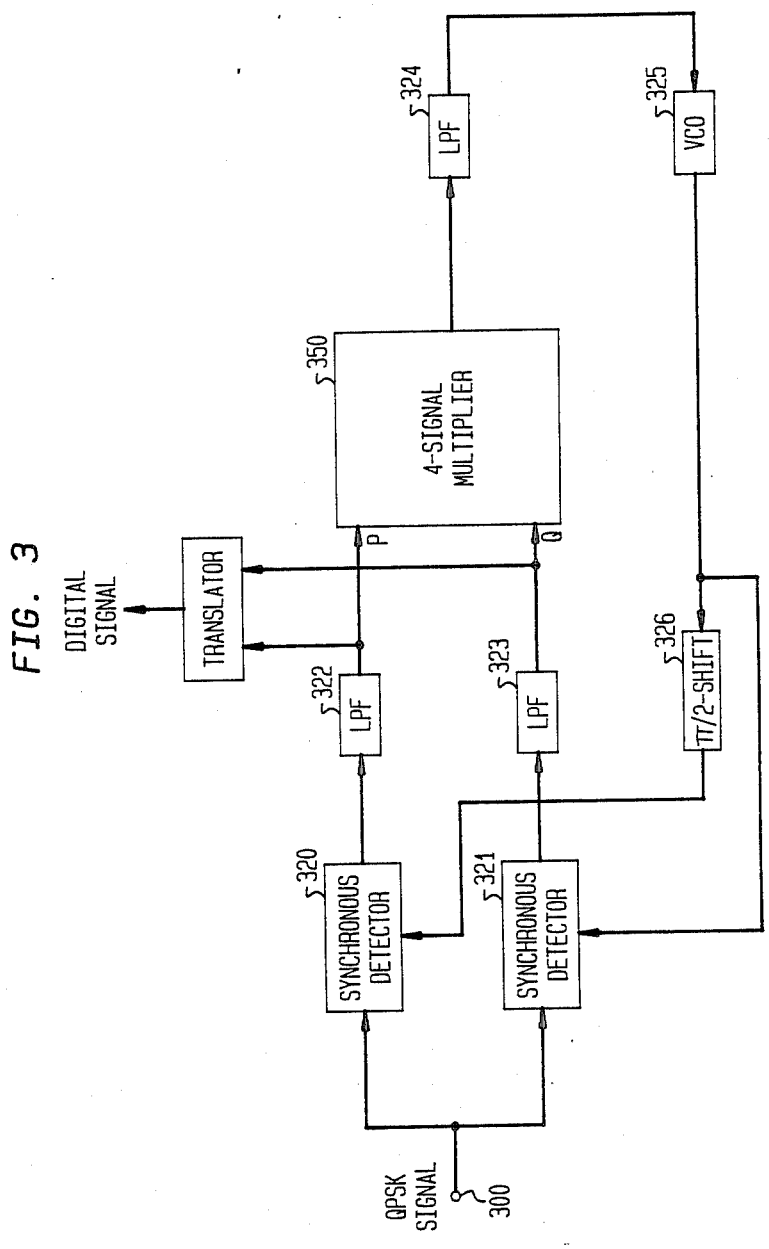
FIG. 3 is a black diagram of a demodulator by the Costas loop using the circuit according to the present invention.

FIG. 3 is a block diagram showing a demodulator using the carrier recovering circuit by means of the Costas loop method.

A quadraphase shift-keyed signal is supplied through an input terminal 300 to two synchronous-detectors 320 and 321. The outputs of these detectors 320 and 321 are supplied to low-pass filters 322 and 323 to obtain signals P and Q. The signals P and Q are supplied to a translator 360 to reproduce four combinationsof two-bit digital data, and further supplied to a four-signal multiplier 350 shown in FIGS. 1 or 2. The output of the multiplier 350 is supplied to a low-pass filters 324, the output of which is supplied as a control signal to a voltage controlled oscillator 325 to control the oscillation frequency thereof. The output of the oscillator 325 is supplied as a reference phase signal to the 321, and further supplied through a $\pi/2$-phase shifting circuit 326 to the detector 320.

Since the multiplier 350 is highly speeded up as has been described hereinbefore, the responding speed of the carrier recovering circuit is very high. Further, its power consumption is reduced.

The present invention is not limited to the above-mentioned embodiments, but may be modifiable and changeable without departing from the scope and sprit of the present invention. For example, the transistors 128, 129, 132, 133, 136 and 137 in FIGS. 1 and 2 may be omitted, because the signal multiplication operations are not disturbed without these transistors. In this case, however, the D.C. voltages at the signal output terminals 122 and 123 are changed.

What is claimed is:

1. A transistor circuit comprising first, second and third multipliers, each of said multipliers including first, second, third and fourth input ends, first and second output ends, a first transistor having an emitter connected to said first input end, a base connected to said third input end and a collector connected to said first output end, a second transistor having an emitter connected to said first input end, a base connected to said fourth input end and a collector connected to said second output end, a third transistor having an emitter connected to said second input end, a base connected to said fourth input end and a collector connected to said first output end, and a fourth transistor having an emitter connected to said second input end, a base connected to said third input end and a collector connected to said second output end, said first and second output ends of said first multiplier being connected respectively to said first and second input ends of said second multiplier, said first and second output ends of said second multiplier being connected respectively to said first and second input ends of said third multiplier, a first input terminal supplied with a first signal P, a second input terminal supplied with a second signal Q, an output terminal connected to said first output end of said third multiplier, first signal-supply means coupled to said first input terminal for supplying third and fourth signals each proportional to said first signal P to said first and second input ends of said first multiplier, respectively, a phase of said third signal being opposite to a phase of said fourth signal, second signal-supply means coupled to said first input terminal for supplying fifth and sixth signals each proportional to said first signal P to the third input ends of said second and third multipliers, respectively, a phase of said fifth signal being equal to a phase of said sixth signal, third signal-supply means coupled to said second input terminal for supplying a seventh signal proportional to said second signal Q to said third input end of said first multiplier, and fourth signal-supply means coupled to said second input terminal for supplying eighth and ninth signals each proportional to said second signal Q to the fourth input ends of said second and third multipliers, respectively, a phase of said eighth signal being opposite to a phase of said ninth signal, whereby an output signal having the value of $P \times Q \times (P+Q) \times (P-Q)$ is produced from said output terminal.

2. The transistor circuit as claimed in claim 1, wherein said first signal-supply means comprises fifth and sixth transistors and a current source, said fifth transistor having a base connected to said first input terminal and a collector connected to said first input end of said first multiplier, said sixth transistor having a base supplied with a first bias voltage and a collector connected to said second input end of said first multipliers, emitters of said fifth and sixth transistors being connected in common to said current source.

3. The transistor circuit as claimed in claim 2, wherein said fourth input end of said multiplier is supplied with a second bias voltage.

4. A transistor circuit comprising: first, second and third multipliers, each of said multipliers including first, second, third and fourth input ends, first and second output ends, a first transistor having an emitter connected to said first input end, a base connected to said third input end and a collector connected to said first output end, a second transistor having an emitter connected to said first input end, a base connected to said fourth input end and a collector connected to said second output and, a third transistor having an emitter connected to said second input end, a base connected to said fourth input end and a collector connected to said first output end, and a fourth transistor having an emitter connected to said second input end, a base connected to said third input end and a collector connected to said second output end, said first and second output ends of said first multiplier being connected respectively to said first and second input ends of said second multiplier, said first and second output ends of said second multiplier being connected respectively to said first and second input ends of said third multiplier; a first input terminal supplied with a first signal P; a second input terminal supplied with a second signal Q; an output terminal connected to said first output end of said third multiplier; means for generating first and second bias voltages; a first current source; a fifth transistor having an emitter connected to said first current source, a base connected to said first input terminal and a collector connected to said first input end of said first multiplier; a sixth transistor having an emitter connected to said first current source, a base supplied with said first bias voltage and a collector connected to said second input end of said first multiplier; a first differential amplifier having a first input node connected to said first input terminal, a second input node supplied with said first bias voltage and an output node connected to said third input end of said second multiplier; a second differential amplifier having a first input node connected to said first input terminal, a second input node supplied with said first bias voltage and an output node connected to said third input end of said third multiplier; a third differential amplifier having a first input node connected to said second input terminal, a second input node supplied with said second bias voltage, a first output node connected to said fourth input end of said second multiplier and a second output node connected to said fourth input end of said third multiplier, a signal derived from said first output node of said third differential amplifier having a phase opposite to that of a signal derived from said second output node thereof; means for supplying said second bias voltage to said third input end of said first multiplier; and means for connecting said second input terminal to said fourth input end of said first multiplier; whereby an output signal derived from said output terminal represents a product of multiplication of said first signal P, said second signal Q, a summed signal (P+Q) thereof and a subtracted signal (P−Q) thereof.

5. The transistor circuit as claimed in claim 4, wherein each of said first and second differential amplifiers includes a seventh and an eighth transistor, a first and a second resistor, and a second current source, said seventh transistor having a base connected to the first input node, an emitter connected to said second current source via said first resistor and a collector supplied with a power voltage, said eighth transistor having a base connected to the second input node, an emitter connected to said second current source via said second resistor and a collector connected to the output node, and wherein said third differential amplifier includes a ninth and a tenth transistor, a third and a fourth resistor, and a third current source, said ninth transistor having a base connected to said first input node, an emitter connected to said third current source via said third resistor and a collector connected to the second output node, said tenth transistor having a base connected to the second input node, an emitter connected to said third current source via said fourth resistor and a collector connected to the first output node.

6. A transistor circuit comprising first, second and third multipliers, each of said multipliers including a first, a second, a third and a fourth input end, a first and a second output end, a first transistor having an emitter connected to said first input end, a base connected to said third input end and a collector connected to said first output end, a second transistor having an emitter connected to said first input end, a base connected to said fourth input end and a collector connected to said second output end, a third transistor having an emitter connected to said second input end, a base connected to said fourth input end and a collector connected to said first output end, and a fourth transistor having an emitter connected to said second input end, a base connected to said third input end and a collector connected to said second output end, said first and second output ends of said first multiplier being connected respectively to said first and second input ends of said second multiplier, said first and second output ends of said second multiplier being connected respectively to said first and second input ends of said third multiplier; a first input terminal supplied with a first signal P; a second input terminal supplied with a second signal Q; an output terminal connected to said first output end of said third multiplier; a first emitter-follower transistor circuit having a first input node connected to said first input terminal, a first output node connected to said third input end of said third multiplier, a second output node connected to said third input end of said second multiplier, and a third output node; a second emitter-follower transistor circuit having a second input node connected to said second input terminal, a fourth output node connected to said fourth input end of said third multiplier, a fifth output node connected to said third input end of said first multiplier, and a sixth output node; a bias circuit having a seventh, an eighth and a ninth output node generating a first, a second and a third bias voltage at said seventh, eighth and ninth output nodes thereof, respectively, said seventh and eighth output nodes of said bias circuit being connected respectively to said fourth input ends of said second and first multipliers; a first and a second current source; a fifth transistor having a base connected to said third output node of said first emitter-follower transistor circuit, an emitter connected to said first current source and a collector connected to said first input end of said first multiplier; a sixth transistor having a base connected to said ninth output node of said bias circuit, an emitter connected to said first current source and a collector connected to said second input end of said first multiplier; a seventh transistor having a base connected to said sixth output node of said second emitter-follower transistor circuit, an emitter connected to said second current source and a collector connected to said first input end of said first multiplier; and an eighth transistor having a base connected to said ninth output node of said bias circuit, an emitter connected to said second current source and a collector connected to said second input end of said first multiplier; whereby an output signal having a value of P×Q×(P+Q)×(P−Q) is derived from said output terminal.

7. The transistor circuit as claimed in claim 6, wherein said first emitter-follower transistor circuit includes a ninth transistor having a base connected to the first input node, a collector applied with a power voltage and an emitter connected to the first output node, first and second diodes connected in series between the first and second output node, third to sixth diodes connected in series between the second and third output nodes, and a third current source connected to the third output node; said second emitter-follower transistor circuit including a tenth transistor having a base connected to the second input node; a collector applied with said power voltage and an emitter connected to the fourth output node, seventh to tenth diodes connected in series between the fourth and fifth output nodes, eleventh and twelfth diodes connected in series between the fifth and sixth output nodes, and a fourth current source connected to the sixth output node; said bias circuit including an eleventh transistor having a base applied with a reference voltage and a collector applied with said power voltage, thirteenth and fourteenth diodes connected in series between an emitter of said eleventh transistor and the seventh output node, fifteenth and sixteenth diodes connected in series between the seventh and eigth output nodes, seventeenth and eigteenth diodes connected in series between the eighth and ninth output nodes, and a fifth current source connected to the ninth output node.

8. A demodulator for a quadraphase shift-keyed signal comprising a first synchronous detector detecting said quadraphase shift-keyed signal with a first reference signal, a first low-pass filter coupled to an output of said first synchronous detector and producing a first detected signal P, a second synchronous detector detecting said quadraphase shaft-keyed signal with a second reference signal, a phase of said first reference signal being different from a phase of said second reference signal by pi/2, a second low-pass filter coupled to an output of said second synchronous detector and producing a second detected signal Q, a signal multiplier receiving said first detected signal P and said second detected signal Q and producing an output signal having a value of P×Q×(P+Q)×(P−Q), a third low-pass filter receiving said output signal, and means coupled to said third low-pass filter for generating said first and second reference signals whose frequencies and/or phases are controlled by an output of said third low-pass filter, said signal multiplier comprising first, second and third multipliers, each of said multipliers including first, second, third and fourth input ends, first and second output ends, a first transistor having an emitter connected to said first input end, a base connected to said third input end and a collector connected to said first output end, a second transistor having an emitter connected to said first input end, a base connected to said fourth input end and a collector connected to said second output end, a third transistor having an emitter connected to said second input end, a base connected to said fourth input end and a collector connected o said first output end, and a fourth transistor having an emitter connected to said second input end, a base connected to said third input end and a collector connected to said second output end, said first and second output ends of said first multiplier being connected respectively to said first and second input ends of said second multiplier, said first and second output ends of said second multiplier being connected respectively to said first and second input ends of said third multiplier, a first input terminal supplied with said first detected signal P, a second input terminal supplied with said second detected signal Q, an output terminal connected to said first output end of said third multiplier, first signal-supply means coupled to said first input terminal for supplying third and fourth signals each proportional to said first detected signal P to said first and second input ends of said first multiplier, respectively, a phase of said third signal being opposite to a phase of said fourth signal, second signal-supply means coupled to said first input terminal for supplying fifth and sixth signals each proportional to said first detected signal P to said third input ends of said second and third multipliers, respectively, a phase of said fifth signal being equal to a phase of said sixth signal, third signal-supply means coupled to said second input terminal for supplying a seventh signal proportional to said second detected signal Q to said third input end of said first multiplier, and fourth signal-supply means coupled to said second input terminal for supplying an eighth and a ninth signal each proportional to said second detected signal Q to said fourth input ends of said second and third multipliers, respectively, a phase of said eighth signal being opposite to a phase of said ninth signal, said signal multiplier producing said output signal from said output terminal.

9. A transistor circuit comprising a first input terminal supplied with a first signal, a second input terminal supplied with a second signal, first and second multipliers each including first, second, third and fourth input ends, first and second output ends, a first transistor having an emitter connected to said first input end, a base connected to said third input end and a collector connected to said first output end, a second transistor having an emitter connected to said first input end, a base connected to said fourth input end and a collector connected to said second output end, a third transistor having an emitter connected to said second input end, a base connected to said fourth input end and a collector connected to said first output end, and a fourth transistor having an emitter connected to said second input end, a base connected to said third input end and a collector connected to said second output end, said first and second output ends of said first multiplier being connected to said first and second input ends of said second multiplier, means coupled to said first input terminal for supplying third and fourth signals to said first and second input ends of said first multiplier, respectively, each of said third and fourth signals being related to said first input signal and said third signal having a phase opposite to a phase of said fourth signal, means coupled to said second input terminal for supplying a fifth signal relative to said second signal to said end of said first multiplier, means coupled to said first input terminal for supplying a sixth signal relative to said first signal to said third input end of said second multiplier, means coupled to said second input terminal for supplying a seventh signal relative to said second signal to said fourth input end of said second multiplier, an output terminal, and means for connecting said output terminal to said first output end of said second multiplier, whereby an output signal having a value which is a product of multiplication of said first signal, said second signal and a summed signal of said first and second signals or a subtracted signal of said first and second signals is derived from said output terminal.

10. A transistor circuit comprising a first input terminal receiving a first signal, a second input terminal receiving a second signal, an output terminal, first to tenth nodes, means coupled between said first input terminal and said first node for supplying an inverted signal of said first signal to said first node, means coupled between said first input terminal and said second node for supplying said first signal to said second node, means coupled between said second input terminal and said third node for supplying said second signal to said third node, means for supplying a bias voltage to said fourth node, means coupled between said first input terminal and said fifth node for supplying said first signal to said fifth node, means coupled between said second input terminal and said sixth node for supplying said second signal to said sixth node, a first transistor having an emitter connected to said first node, a base connected to said fourth node and a collector connected to said seventh node, a second transistor having an emitter connected to said first node, a base connected to third node and a collector connected to said eighth node, a third transistor having an emitter connected to said second node, a base connected to said third node and a collector connected to said seventh node, a fourth transistor having an emitter connected to said second node, a base connected to said fourth node and a collector connected to said eighth node, a fifth transistor having an emitter connected to said seventh node, a base connected to said fifth node and a collector connected to said ninth node, a sixth transistor having an emitter connected to said seventh node, a base connected to said sixth node and a collector connected to said tenth node, a seventh transistor having an emitter connected to said eighth, a base connected to said sixth node and a collector connected to said ninth node, an eighth transistor having an emitter connected to said eighth node, a base connected to said fifth node and a collector connected to said tenth node, and means for coupling said ninth to said output terminal.

* * * * *